(12) United States Patent
Abraham et al.

(10) Patent No.: US 10,937,941 B2
(45) Date of Patent: *Mar. 2, 2021

(54) MECHANICALLY TUNABLE SUPERCONDUCTING QUBIT

(71) Applicant: INTERNATIONAL BUSINESS MACHINES CORPORATION, Armonk, NY (US)

(72) Inventors: David W. Abraham, Croton, NY (US); Jerry M. Chow, White Plains, NY (US); Jay M. Gambetta, Yorktown Heights, NY (US); John A. Smolin, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/045,080

(22) Filed: Jul. 25, 2018

(65) Prior Publication Data

US 2018/0331274 A1 Nov. 15, 2018

Related U.S. Application Data

(63) Continuation of application No. 15/653,857, filed on Jul. 19, 2017, now Pat. No. 10,056,540, which is a (Continued)

(51) Int. Cl.
*H01L 39/10* (2006.01)
*H03K 3/38* (2006.01)
*H01L 39/02* (2006.01)
*H01L 39/22* (2006.01)
*H01L 39/04* (2006.01)
(Continued)

(52) U.S. Cl.
CPC ............ *H01L 39/10* (2013.01); *H01L 39/025* (2013.01); *H01L 39/045* (2013.01); *H01L 39/223* (2013.01); *H01L 39/2493* (2013.01); *H03K 3/38* (2013.01); *H01L 41/094* (2013.01)

(58) Field of Classification Search
None
See application file for complete search history.

(56) References Cited

U.S. PATENT DOCUMENTS 6,347,237 B1 2/2002 Eden
6,360,112 B1 3/2002 Mizuno et al.
(Continued)

FOREIGN PATENT DOCUMENTS

EP 0985246 B1 12/2005
WO 9950931 A1 10/1999

OTHER PUBLICATIONS

Hontsu, S. et al., "Study of Mechanically Tunable Superconducting Microwave Filter Using Lumped Elements," IEEE Transactions on Applied Superconductivity, vol. 13, No. 2, Jun. 2003. (pp. 720-723).
(Continued)

*Primary Examiner* — Jeffery S Zweizig
(74) *Attorney, Agent, or Firm* — Erik K. Johnson

(57) ABSTRACT

A system for adjusting qubit frequency includes a qubit device having a Josephson junction and a shunt capacitor coupled to electrodes of the Josephson junction. A cantilevered conductor is separated from the shunt capacitor by a spacing. An adjustment mechanism is configured to deflect the cantilevered conductor to tune a qubit frequency for the qubit device.

20 Claims, 5 Drawing Sheets

Related U.S. Application Data continuation of application No. 15/263,940, filed on Sep. 13, 2016, now Pat. No. 9,935,252, which is a continuation of application No. 14/856,172, filed on Sep. 16, 2015, now Pat. No. 9,503,063.

(51) Int. Cl.
*H01L 39/24* (2006.01)
*H01L 41/09* (2006.01)

(56) References Cited

U.S. PATENT DOCUMENTS

| | | | |
|---|---|---|---|
| 6,662,029 B2 | 12/2003 | Eden et al. |
| 6,778,042 B2 | 8/2004 | Terashima et al. |
| 6,900,454 B2 | 5/2005 | Blais |
| 6,937,456 B2 | 8/2005 | Pasternak |
| 7,085,121 B2 | 8/2006 | Lynch et al. |
| 7,567,145 B2 | 7/2009 | Akasegawa et al. |
| 7,646,268 B1 | 1/2010 | Tsironis |
| 7,653,371 B2 | 1/2010 | Floyd |
| 8,111,083 B1 | 2/2012 | Pesetski |
| 8,841,764 B2 | 9/2014 | Poletto |
| 8,872,360 B2 | 10/2014 | Chow et al. |
| 8,928,391 B2 | 1/2015 | Naaman et al. |
| 8,975,912 B2 | 3/2015 | Chow et al. |
| 9,503,063 B1 | 11/2016 | Abraham |
| 9,935,252 B2 | 4/2018 | Abraham |
| 10,056,540 B2 | 8/2018 | Abraham |
| 2016/0292586 A1 | 10/2016 | Rigetti |
| 2017/0072504 A1 | 3/2017 | Abraham |
| 2017/0116542 A1 | 4/2017 | Shim |

OTHER PUBLICATIONS

Peng, H. et al., "IEEE Transactions on Applied Superconductivity," vol. 19, No. 4, Aug. 2009. (pp. 3683-3687).

Rafique, R. et al., "Niobium Tunable Microwave Filter," IEEE Transactions on Microwave Theory and Techniques, vol. 57, No. 5, May 2009. (pp. 1173-1179).

MECHANICALLY TUNABLE SUPERCONDUCTING QUBIT

BACKGROUND

Technical Field

The present invention relates to superconductor qubits, and more particularly to devices and methods for tuning qubit frequencies.

Description of the Related Art

Superconducting quantum bits (qubits) show great promise for quantum computing, with ever-increasing coherence times combined with the possibility of standard semiconductor fabrication methods leading to a useful quantum computer. However, one outstanding problem is in the control of qubit frequencies.

Quantum computers will require qubits with tightly controlled distributions of frequency. For the specific case of superconducting qubits, the frequency is determined by a Josephson junction critical current $I_c$ and a total shunt capacitance, with a frequency given by $f=\frac{1}{2\pi\sqrt{LC}}$. The inductance L is dominated by that of the Josephson junction and is given by $$L = \frac{\Phi_0}{2\pi I_c}$$

where $\Phi_0$ is the flux quantum. The capacitance C is the sum of junction capacitance and the shunt capacitance. Typically, experiments and estimates both show that the capacitance can be well controlled and typically fluctuations are due to variations in junction critical current. Typical distributions of frequency have standard deviations of 5-10%. It is desirable to control the frequency of the qubit population to much better than this, typically providing standard deviations of less than 1%.

The observed spread in Josephson junction critical currents is in the range of 10% standard deviation, corresponding to ~5% spread in qubit frequency. Despite decades of research into fabrication and control of Josephson junctions, no significant improvement has been seen in the spread observed. Similar spreads are observed in other oxide junction technologies such as magnetic memory (MRAM), indicating that this may be an intrinsic property of such devices.

Qubit frequencies need to be controlled, and the fabrication process typically used for making these devices results in a spread of frequencies, which is insufficient for application in a large scale quantum computer.

SUMMARY

A system for adjusting qubit frequency includes a qubit device having a Josephson junction and a shunt capacitor coupled to electrodes of the Josephson junction. A cantilevered conductor is separated from the shunt capacitor by a spacing. An adjustment mechanism is configured to deflect the cantilevered conductor to tune a qubit frequency for the qubit device.

Another system for adjusting qubit frequency includes a qubit device including a Josephson junction and a shunt capacitor coupled to electrodes of the Josephson junction. A housing at least partially encapsulates the qubit device. A cantilevered conductor is formed in a portion of the housing and separated from the shunt capacitor by a spacing, the cantilevered conductor being connected to a ground and capable of movement within the housing. An adjustment mechanism is configured to deflect the cantilevered conductor to tune a qubit frequency for the qubit device.

A method for adjusting qubit frequency includes measuring a qubit frequency of a qubit device; computing an adjustment to achieve a desired qubit frequency; adjusting a space between a cantilevered conductor and a shunt capacitor of the qubit device; and verifying that the qubit frequency has been corrected by the adjusting of the space.

Another system for adjusting qubit frequency includes a qubit device and an adjustable shunt capacitance of the qubit device to tune a qubit frequency.

Another system for adjusting qubit frequency includes a qubit device, an adjustable shunt capacitance of the qubit device to tune a qubit frequency and a housing at least partially encapsulating the qubit device.

Another method for adjusting qubit frequency includes adjusting a space between a conductor and a shunt capacitor of a qubit device; and verifying a qubit frequency of the qubit device.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
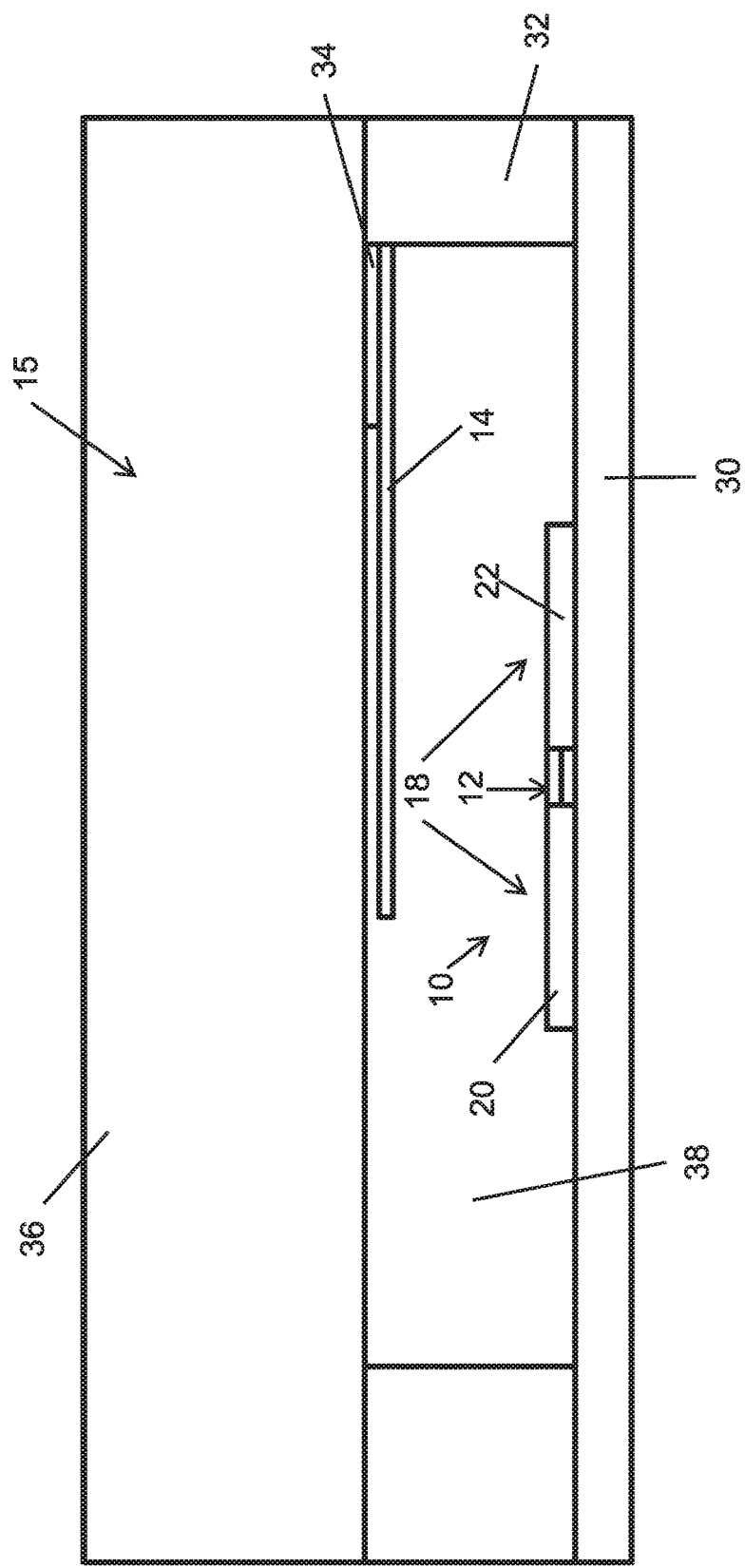
FIG. 1 is a cross-sectional view of a qubit device in a housing or structure with a cantilevered conductor over a shunt capacitor for tuning qubit frequency in accordance with the present principles.

In accordance with the present principles, methods and systems are provided that adjust each qubit frequency to eliminate undesirable spreads of frequencies. In one embodiment, qubit frequency is adjusted by altering shunt capacitance(s) to ground. This can be achieved by providing an adjustable capacitance between one or both of the qubit shunt capacitor pads to ground. The qubit frequency can be adjusted by changing the qubit capacitance.

Qubit capacitance may be adjusted using a relationship such as qubit frequency$\rightarrow\omega+\omega\Delta C/2C$. So to change the frequency by 5%, the capacitance is changed by 10% which, in one example, can amount to about 6 fF. The impact of such a difference in capacitance (6 fF) on the qubit frequency only results in a 30 MHz change in the anharmonicity. This will not limit the qubit performance and will tune qubit frequency with only minor effects on the qubit anharmonicity. In useful embodiments, a mechanical cantilever is coated with metal and spaced apart from the shunt capacitor pads. The spacing between the cantilever and the qubit shunt capacitor is adjusted to tune the qubit frequency. Spacing may be adjusted in a plurality of ways, e.g., by mechanical or electrical methods. In one embodiment, accurate adjustment of the qubit is provided to ensure a qubit frequency remains with an acceptable tolerance for one of a plurality of distinct frequency values needed for quantum computing.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. The chips are packaged in a manner consistent with the cryogenic environment needed by the qubits and then would be assembled into a larger system forming a quantum computer or other device employing the properties of the qubit structures.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a schematic diagram shows a qubit 10 having a Josephson junction 12. The qubit 10 represents a state device for a superconducting quantum computer or other device. A shunt capacitor 18 is coupled to superconducting electrodes of the Josephson junction 12. The shunt capacitor 18 in this embodiment includes a planar capacitor having pads 20, 22.

Supercurrent ($I_s$) through a Josephson junction (JJ) is given by $I_s=I_c \sin(\varphi)$, where $\varphi$ is the phase difference of superconducting wave functions of the two electrodes 20, 22, i.e. the Josephson phase. Critical current ($I_c$) is the maximum supercurrent that can flow through the Josephson junction 12. This critical current gives rise to a non-linear inductance L given by $$L = \frac{\Phi_0}{2\pi I_c}$$

where $\Phi_0$ is the flux quantum. The qubit is a microwave oscillator with a characteristic frequency for the 0-1 transition given by $\omega=1/\sqrt{LC}$, where L is the inductance of the Josephson junction 12 and C is the shunt capacitance defined by plates 20 and 22.

The qubit 10 has a characteristic frequency determined by a capacitance between one or more of the pads 20, 22 and an inductance of the Josephson junction 12. With the addition of a cantilevered conductor 14 in proximity of the pads 20, 22, the qubit frequency can be adjusted. By controlling a position of the cantilevered conductor 14, the capacitance from one or both qubit capacitor pads 20 and 22 to ground can be controlled, e.g., by bending the cantilevered conductor 14. The effective shunt capacitance of the qubit depends on the combination of capacitances between pads 20 and 22, plus capacitance of each pad 20 and 22 to ground. Therefore, by adjusting the latter two capacitance terms, the effective shunt capacitance of the qubit (and therefore qubit frequency) is adjusted as well. The cantilevered conductor 14 may include a flexible material, such as a polymer or a metal. If a polymer is employed, the polymer is conductive or may be coated in metal if the polymer is formed from dielectric material.

The cantilevered conductor 14 is grounded and may be suspended in a structure or housing 15 using semiconductor processing. For example, the qubit 10 may be formed on a substrate 30. A dielectric layer or layers 32 are deposited. A metal layer (14) is deposited on a support material 34. The support material 34 may bond to the metal (14) and may include, e.g., an oxide or a nitride. The metal (14) is patterned. A sacrificial material may be deposited in a cavity 38. The sacrificial material may include, e.g., polysilicon or amorphous silicon. Then, another dielectric layer 36 is formed over the qubit 10 and cantilevered conductor 14. The sacrificial material is removed by a selective etch to expose the metal 14 and the qubit 10 in the cavity 38. Other processing methods may be employed to isolate the qubits 10 and the cantilevered conductor 14. The cantilevered conductor 14 is connected to ground potential (connection through the layer 36 (not shown)).

In one conservative example, a change the capacitance of 6 fF is needed for a qubit. To get a 6 fF change in a 200 micron×100 micron pad (20, 22) in the air, 10 microns away, a deflection of the cantilevered conductor 14 of about 5 microns is needed. Assuming a control level of 1/10 micron, a capacitance error of about 0.17 fF is achieved. In other words, $\Delta C = C \Delta x/d$ where d is the distance to the pad (20, 22) from the cantilevered conductor 14 and $\Delta x$ is the change in d. If noise is assumed on this distance, then $|\Delta C|/C = |\Delta x/d|$ so the frequency will be $|\Delta \omega|/\omega = |\omega x/(2d)|$. If we want kHz range frequency changes, we need to make sure $\Delta x$ is controlled to less than a 1 micron change. The vibrational mode of these devices tends to be much less than this.

In one embodiment, the as-formed metal 14 may provide the needed adjustment to the capacitance to achieve the desired qubit frequency. However, in accordance with the present principles, an adjustment mechanism is employed to tune the metal 14 to achieve a desired qubit frequency. The adjustment mechanism may include mechanical, electrical, electro-mechanical, magnetic or any other mechanism configured to change a spacing or shape of the cantilevered conductor.

Figure 2:
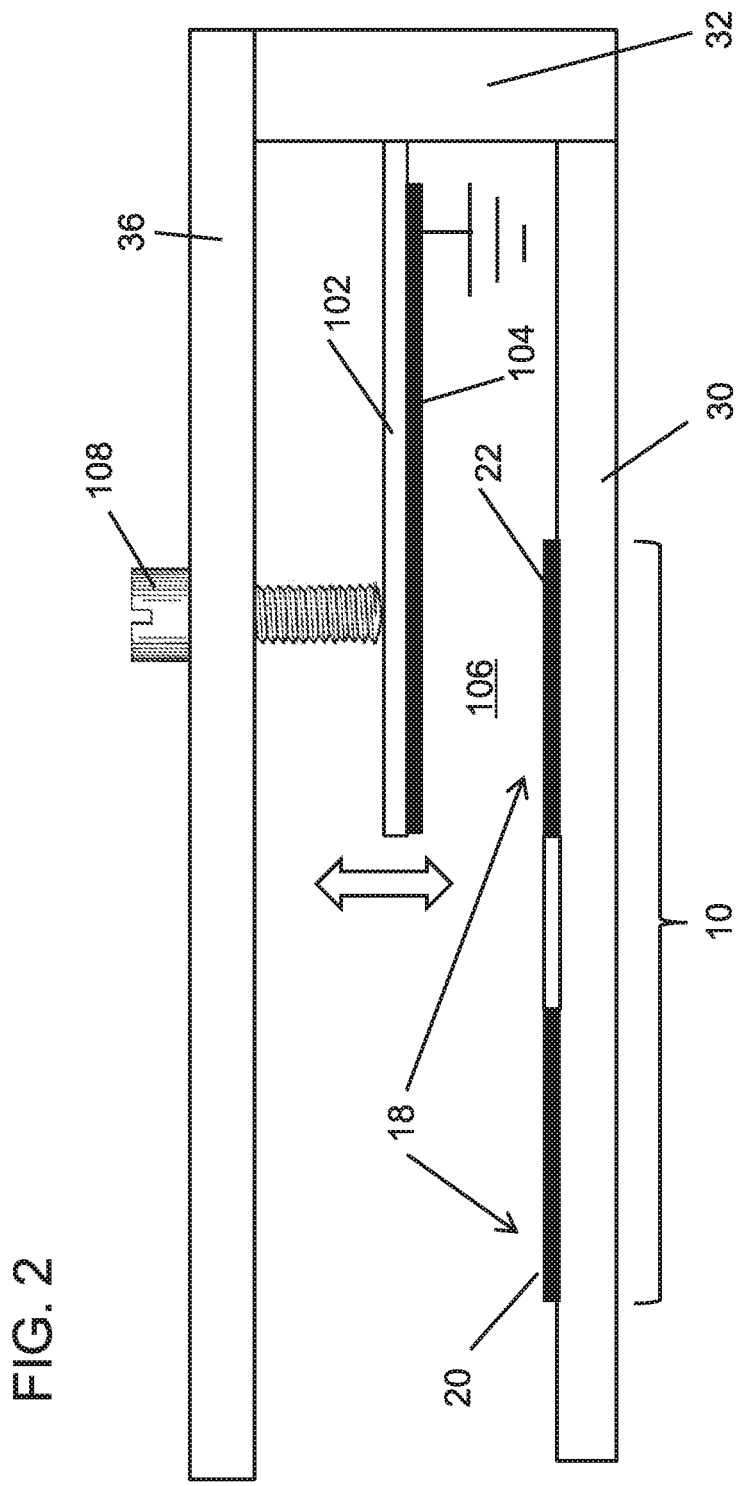
FIG. 2 is a cross-sectional view of a qubit device in a housing or structure with a cantilevered conductor adjusted using a mechanical adjustment mechanism to control a space or shape of the cantilevered conductor over a shunt capacitor for tuning qubit frequency in accordance with the present principles.

Referring to FIG. 2, one embodiment employs the adjustment mechanism as a mechanical adjustment for the cantilevered conductor 14 (FIG. 1). A mechanical cantilever 102 may be metal or coated with metal 104. The metal 104 may include Al, Cu, Ni, Pt, Au, or other conductive materials. The metal 104 is grounded. A spacing 106 between the cantilever 102 and the qubit shunt capacitor 18 is adjusted to tune the qubit frequency, as described. The spacing 106 may be adjusted using an actuation device 108. The actuation device 108 may include a screw, a cam, a solenoid actuated arm, a piezoelectric actuator, or equivalents.

Figure 3:
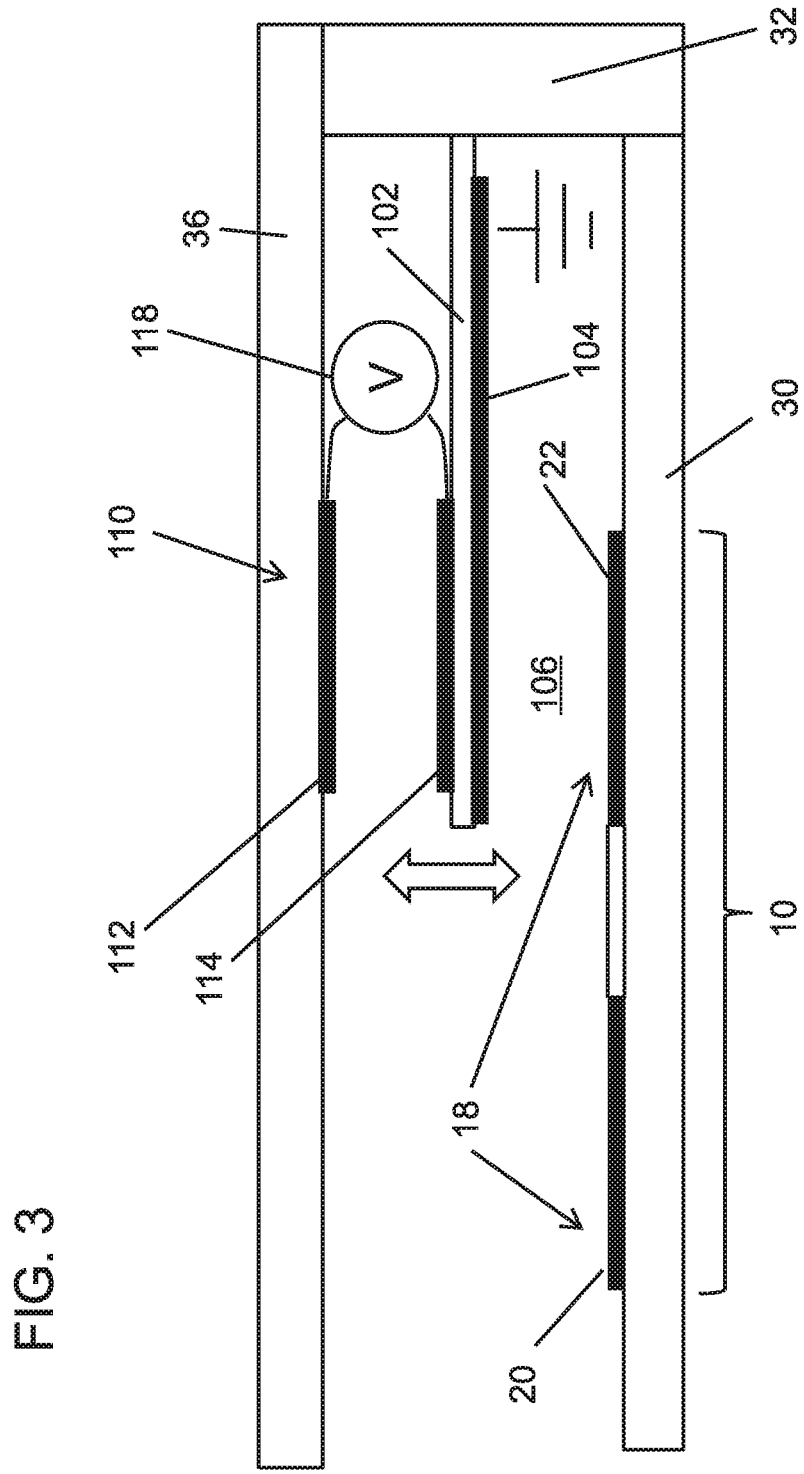
FIG. 3 is a cross-sectional view of a qubit device in a housing or structure with a cantilevered conductor adjusted using an electrical adjustment mechanism to control a space or shape of the cantilevered conductor over a shunt capacitor for tuning qubit frequency in accordance with the present principles.

Referring to FIG. 3, another embodiment of the adjustment mechanism employs an electrical adjustment for the cantilevered conductor 14 (FIG. 1). The mechanical cantilever 102 may be metal or coated with metal 104. The metal 104 may include Al, Cu, Ni, Pt, Au, or other conductive materials and preferably superconducting materials, such as Al, Nb, etc. The metal 104 is grounded. A spacing 106 between the cantilever 102 and the qubit shunt capacitor 18 is adjusted to tune the qubit frequency, as described. The spacing 106 may be adjusted using a capacitive force actuation device 110. The actuation device 110 may include two plates 112, 114. One plate 112 is fixed to structure or layer 116, and the other plate 114 is coupled to the cantilever 102. A voltage source 118 is coupled to the plates to generate charge build up on the plates 112 and 114. The charge build up can be controlled, such that the amount of charge causes the spacing 106 to change, which in turn tunes the qubit frequency of the qubit 10. Other methods may also be employed, e.g., using magnetic fields produced by inductors to deflect the cantilever.

In accordance with one embodiment, an estimate of capacitive force may be provided. The area of the capacitor formed by plates 112 and 114 may be, e.g., 200×100 microns with a gap between the plates of, e.g., 10 microns. The capacitance=17 fF. The force is given by $(\frac{1}{2} CV^2)/\text{Gap}$. For the voltage source output of 1 volt, the force is $1.7 \times 10^{-9}$ N. The force constant is 0.01 N/m and the displacement is $1.7 \times 10^{-7}$ m (or 0.2 microns). In this example, displacements on the order tenths of microns are achieved with one volt. This is sufficient to change qubit shunt to ground and alter the qubit frequency.

Figure 4:
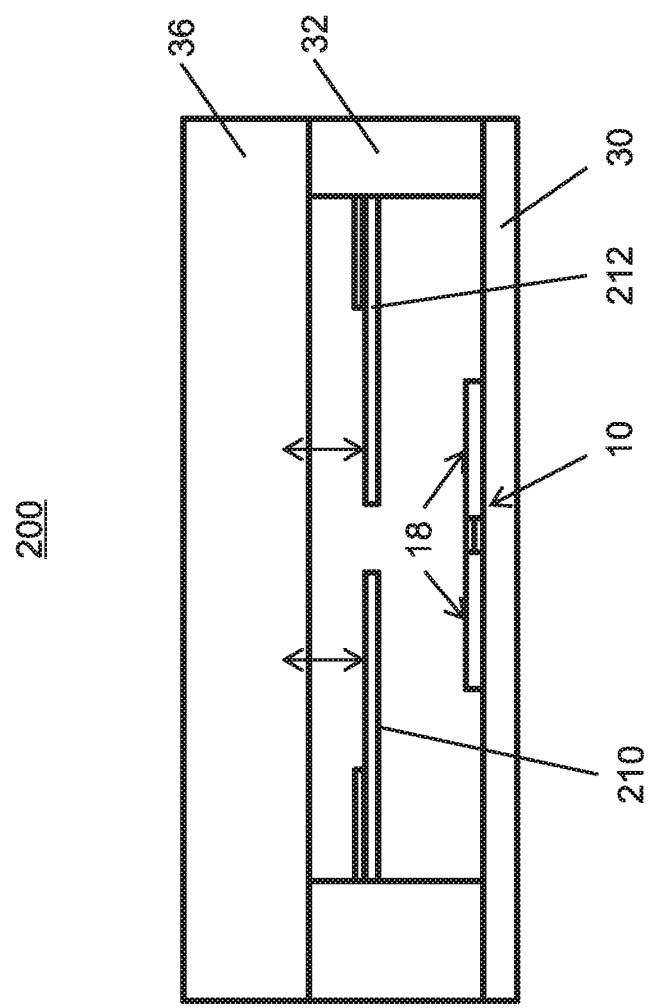
FIG. 4 is a cross-sectional view of a qubit device in a housing or structure with two cantilevered conductors over a shunt capacitor for tuning qubit frequency in accordance with the present principles.

Referring to FIG. 4, other embodiments may employ more than one cantilevered ground metal. A system 200 includes two conductive cantilevers 210 and 212. The cantilevers 210, 212 may be deflected using mechanical, electrical or other methods. The cantilevers 210, 212 may be deflected together or separately and may be deflected by a same amount or different amounts, as needed.

In accordance with the present principles, to adjust each qubit frequency to eliminate undesirable spreads of frequencies, adjustment of the qubit is provided to ensure a qubit frequency remains within an acceptable tolerance for one of the distinct frequency values needed for quantum computing. To control the qubit frequencies, adjustment to the capacitance of the qubit may be provided using cantilevered conductors.

It should be understood that FIGS. 1-4 illustratively depict a Josephson junction as the qubit device; however, other devices may be employed. In addition, while the shunt capacitor is the structure being adjusted, it is understood that adjustments may be made on other structures to adjust the frequency of the qubit device.

Figure 5:
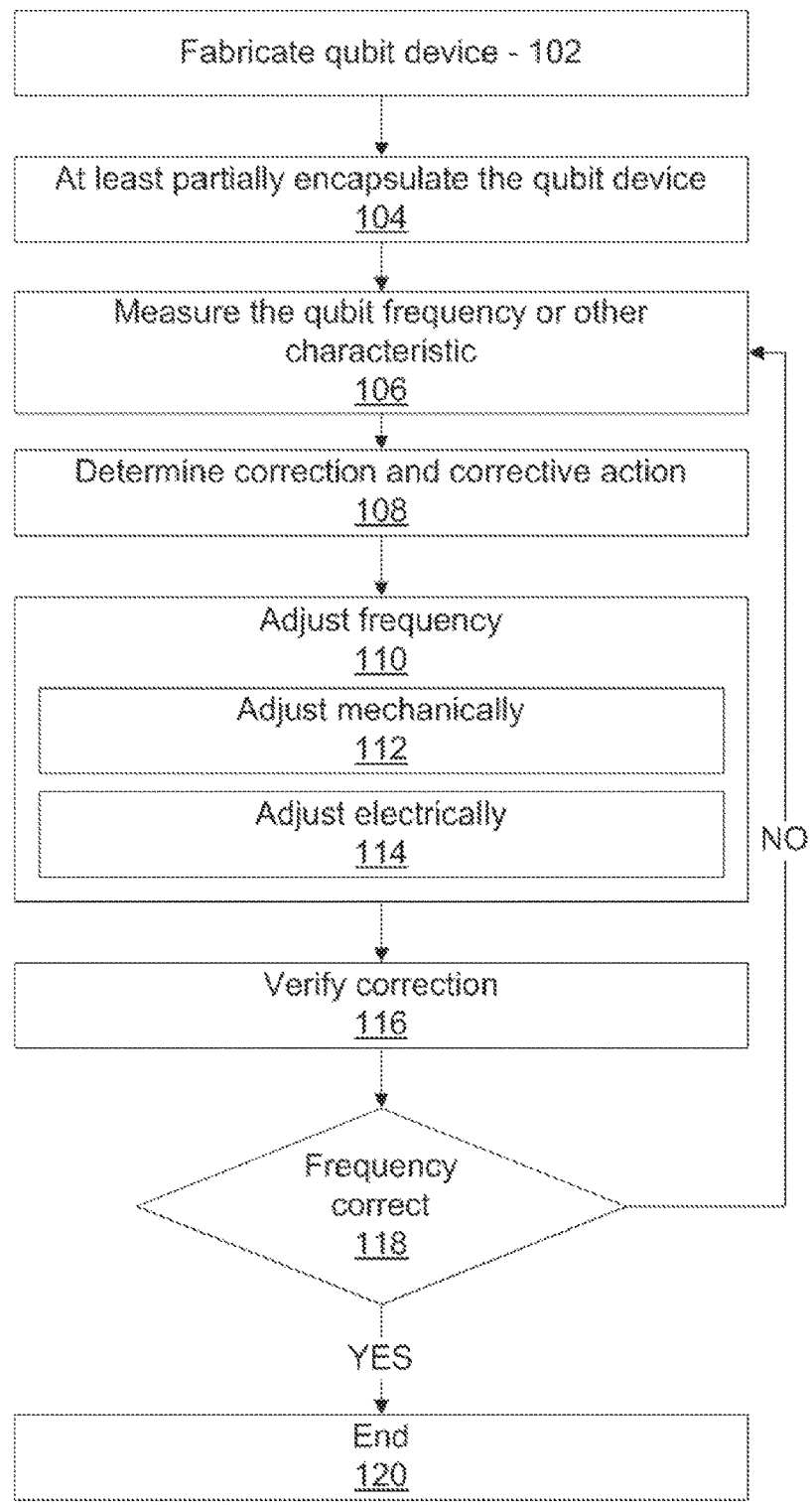
FIG. 5 is a block/flow diagram showing a method for adjusting a qubit frequency in accordance with illustrative embodiments.

Referring to FIG. 5, a block/flow diagram shows a method for adjusting qubit frequency in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a qubit device or a device including qubit devices (e.g., integrated circuit) is fabricated by known processing techniques. In block 104, the qubit device (or qubit) is at least partially encapsulated in a housing. The housing isolates the qubit device and provides a fixed position to mount a conductive cantilever. In block 106, the qubit frequency (distribution) is measured. This may include measuring a relevant metric including qubit frequency, critical current and/or other properties.

In block 108, a correction is determined and needed modifications to correct the qubit frequency are made. Computing the correction includes an accurate calculation of the amount of adjustment to change the spacing or shape of the cantilevered conductor to achieve the desired qubit frequency, while maintaining other qubit parameters, such as, anharmonicity.

In block 110, a space between the cantilevered conductor and a shunt capacitor of the qubit device is adjusted in accordance with the frequency correction. This may include adjusting one or a plurality of cantilevered conductors.

In block 112, adjusting the space may include adjusting a mechanical adjustment to tune the qubit frequency. The mechanical adjustment may include a screw, a cam, a solenoid actuated arm, a piezoelectric actuator, etc. In block 114, adjusting the space may include adjusting an electrical adjustment to tune the qubit frequency. The electrical adjustment may include capacitive plates, wherein one plate is fixed and another is disposed on the cantilevered conductor.

In block 116, a verification measurement may be performed to make sure that the adjustment of the frequency has its intended effect. A determination is made as to whether the frequency is correct. The correct frequency may include one or more distinct operating frequencies of the qubit (e.g., 5 or more). In addition, the frequency correction needs to be within an acceptable tolerance of the distinct distributions of frequency, e.g., less than about 5% and more preferably less than about 1%. In block 118, if the frequency is correct, then the process ends in block 120. Otherwise, the process continues by returning to block 106. The process is repeated as necessary.

Having described preferred embodiments mechanically tunable superconducting qubit (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for adjusting qubit frequency, comprising:
a qubit device; and
an adjustable shunt capacitance of the qubit device to tune a qubit frequency.

2. The system as recited in claim 1, wherein the adjustable shunt capacitance is referenced to ground.

3. The system as recited in claim 1, wherein the adjustable shunt capacitance is tuned by a cantilevered conductor which deflects to tune the qubit frequency for the qubit device.

4. The system as recited in claim 3, wherein the cantilevered conductor includes a metal or a metal coated polymeric material.

5. The system as recited in claim 3, wherein the cantilevered conductor includes a plurality of cantilevered conductors configured to be spaced apart from different portions of the shunt capacitance.

6. The system as recited in claim 3, wherein the adjustable shunt capacitance includes pads and the cantilevered conductor is disposed over one or more of the pads.

7. The system as recited in claim 1, wherein the adjustable shunt capacitance is tuned by an adjustable mechanical device.

8. The system as recited in claim 1, wherein the adjustable shunt capacitance is tuned by an electrical adjustment device.

9. A system for adjusting qubit frequency, comprising:
a qubit device;
an adjustable shunt capacitance of the qubit device to tune a qubit frequency; and
a housing at least partially encapsulating the qubit device.

10. The system as recited in claim 9, wherein the adjustable shunt capacitance is tuned by a cantilevered conductor which deflects to tune the qubit frequency for the qubit device.

11. The system as recited in claim 10, wherein the adjustable shunt capacitance includes pads and the cantilevered conductor is disposed over one or more of the pads.

12. The system as recited in claim 9, wherein the adjustable shunt capacitance is tuned by an adjustable mechanical device.

13. The system as recited in claim 9, wherein the adjustable shunt capacitance is tuned by an electrical adjustment device.

14. The system as recited in claim 13, wherein the electrical adjustment device includes capacitive plates, wherein one plate is fixed to the housing and another is disposed on a cantilevered conductor.

15. The system as recited in claim 14, wherein the cantilevered conductor includes a metal or a metal coated polymeric material.

16. The system as recited in claim 14, wherein the cantilevered conductor includes a plurality of cantilevered conductors configured to be spaced apart from different portions of the shunt capacitance.

17. A method for adjusting qubit frequency, comprising:
adjusting a space between a conductor and a shunt capacitor of a qubit device; and
verifying a qubit frequency of the qubit device.

18. The method as recited in claim 17, further comprising repeating the adjusting until a verification is achieved.

19. The method as recited in claim 17, wherein adjusting the space includes adjusting a mechanical adjustment to tune the qubit frequency.

20. The method as recited in claim 17, wherein adjusting the space includes adjusting an electrical adjustment to tune the qubit frequency.

* * * * *